(12) United States Patent
Kotera et al.

(10) Patent No.: US 10,038,256 B2
(45) Date of Patent: Jul. 31, 2018

(54) MODULE-TERMINAL BLOCK CONNECTION STRUCTURE AND CONNECTION METHOD

(71) Applicant: DAIKIN INDUSTRIES, LTD., Osaka-shi, Osaka (JP)

(72) Inventors: Keito Kotera, Osaka (JP); Hirotaka Doi, Osaka (JP); Nobuyasu Hiraoka, Osaka (JP); Hiroshi Doumae, Osaka (JP); Michiya Takezoe, Osaka (JP); Takuji Koyama, Osaka (JP)

(73) Assignee: Daikin Industries, Ltd., Osaka (JP)

(*) Notice: Subject to any disclaimer, the term of this patent is extended or adjusted under 35 U.S.C. 154(b) by 0 days.

(21) Appl. No.: 15/523,511

(22) PCT Filed: Nov. 4, 2015

(86) PCT No.: PCT/JP2015/081025
§ 371 (c)(1),
(2) Date: May 1, 2017

(87) PCT Pub. No.: WO2016/098475
PCT Pub. Date: Jun. 23, 2016

(65) Prior Publication Data
US 2017/0324173 A1   Nov. 9, 2017

(30) Foreign Application Priority Data

Dec. 17, 2014   (JP) .................................. 2014-255381

(51) Int. Cl.
*H01R 4/34* (2006.01)
*H01R 12/51* (2011.01)
(Continued)

(52) U.S. Cl.
CPC ......... *H01R 12/515* (2013.01); *H01R 4/2429* (2013.01); *H01R 4/2445* (2013.01);
(Continued)

(58) Field of Classification Search
CPC ...... H01R 12/515; H01R 4/34; H01R 12/585; H05K 2201/10409; H05K 2201/10962; H05K 3/32; H05K 2201/1053
(Continued)

(56) References Cited

U.S. PATENT DOCUMENTS

| | | | | |
|---|---|---|---|---|
| 1,177,346 A | * | 3/1916 | Mateer | H01R 4/34 336/192 |
| 2,854,552 A | * | 9/1958 | Gouverneur | H05K 3/222 200/243 |

(Continued)

FOREIGN PATENT DOCUMENTS

| | | |
|---|---|---|
| JP | 58-25051 U | 2/1983 |
| JP | 2-137052 U | 11/1990 |

(Continued)

OTHER PUBLICATIONS

Extended European Search Report issued in corresponding European Application No. 15869683.1 dated May 14, 2018.
(Continued)

*Primary Examiner* — Gary Paumen
(74) *Attorney, Agent, or Firm* — Birch, Stewart, Kolasch & Birch, LLP (57) ABSTRACT

A module-terminal block connection structure includes: a printed wiring board; a terminal block which is disposed on one surface of the printed wiring board and is formed into a three-dimensional shape by a conductive material, the terminal block being fixed to the printed wiring board; a power module which is disposed on the other surface (rear surface) of the printed wiring board and includes an electric circuit and a press-fit type lead pin used as a circuit terminal; and a conductive portion which is electrically connected to the terminal block, includes a hole (through-hole) for press-inserting the lead pin thereinto, and is electrically connected
(Continued)

to the power module while the lead pin is press-inserted into the hole.

8 Claims, 7 Drawing Sheets

(51) Int. Cl.
    *H01R 4/38*     (2006.01)
    *H01R 4/30*     (2006.01)
    *H01R 4/2475*     (2018.01)
    *H01R 4/2429*     (2018.01)
    *H01R 4/2445*     (2018.01)

(52) U.S. Cl.
    CPC ........... *H01R 4/2475* (2013.01); *H01R 4/301* (2013.01); *H01R 4/38* (2013.01)

(58) Field of Classification Search
    USPC ................ 439/78, 81–83, 801; 174/260, 251
    See application file for complete search history.

(56) References Cited

U.S. PATENT DOCUMENTS

| | | | | |
|---|---|---|---|---|
| 3,325,774 A * | 6/1967 | Tucker, Jr. | ............... | H01R 4/34 439/737 |
| 3,384,853 A * | 5/1968 | Rademacher | ........ | H01R 12/526 439/65 |
| 3,624,588 A * | 11/1971 | Farmer | .................. | H01R 12/53 439/801 |
| 4,123,132 A * | 10/1978 | Hardy | ..................... | F16B 39/24 411/337 |
| 4,630,882 A * | 12/1986 | Naylor | .................... | H01R 9/24 439/444 |
| 4,680,672 A * | 7/1987 | May | ......................... | H02B 1/48 361/634 |
| 4,732,568 A * | 3/1988 | Hall | ................... | H01R 13/6592 439/607.28 |
| 4,738,638 A * | 4/1988 | Bogese, II | ....... | H01R 13/65802 439/607.43 |
| 4,792,880 A * | 12/1988 | Cather | ................. | H01R 12/515 174/529 |
| 5,741,161 A * | 4/1998 | Cahaly | ................... | H01R 9/223 439/637 |
| 6,242,993 B1 * | 6/2001 | Fleege | ................ | G01R 31/025 335/18 |
| 6,302,709 B1 * | 10/2001 | Ross | ....................... | H01R 4/34 439/78 |
| 6,319,018 B1 * | 11/2001 | Daoud | ................... | H01R 9/096 439/65 |
| 6,632,108 B1 * | 10/2003 | Hohlfelder | ............ | G08B 25/12 439/709 |
| 9,035,193 B2 * | 5/2015 | Kagimura | ............ | H05K 1/0263 174/251 |
| 2009/0181563 A1 * | 7/2009 | Lin | ........................ | H01R 12/58 439/92 |
| 2011/0036624 A1 | 2/2011 | Kagimura et al. | | |
| 2014/0199861 A1 | 7/2014 | Mattiuzzo | | |

FOREIGN PATENT DOCUMENTS

| | | |
|---|---|---|
| JP | 6-302932 A | 10/1994 |
| JP | 2009-289734 A | 12/2009 |

OTHER PUBLICATIONS

Office Action dated May 1, 2018 in Australian Patent Application No. 2015365104.

\* cited by examiner

MODULE-TERMINAL BLOCK CONNECTION STRUCTURE AND CONNECTION METHOD

TECHNICAL FIELD

The present invention relates to a connection structure and a connection method between a lead pin of a module, which is formed by packaging a predetermined electric circuit, and an external terminal block.

BACKGROUND ART

For example, an inverter in an air conditioner is formed into a power module in which necessary peripheral circuits are packaged, and this power module is attached to a printed wiring board. At that time, lead pins coming out of the power module are soldered to a copper pattern of the printed wiring board. Lead pins of a main circuit through which a current supplied to a motor flows are connected to a terminal block via the copper pattern on the board. A crimp terminal of the electric wire can be connected to the terminal block by screw clamp. The terminal block and other devices are disposed on, for example, a front surface of the printed wiring board, and the power module is disposed on a rear surface. The arrangement on the front and rear surfaces is convenient for attaching a radiation fin to the power module (for example, see Patent Literature 1 (FIG. 3)).

CITATION LIST

Patent Literature

Patent Literature 1: JP 2009-289734 A

SUMMARY OF INVENTION

Technical Problem

Incidentally, since an increase in capacity of the inverter causes an increase in current amount, it is necessary to widen, for example, the width of the copper pattern on the printed circuit board. However, if the width is widened, it becomes difficult to design a pattern considering an insulation distance and generation of heat on a printed wiring board which needs to be compactly formed. In particular, it is difficult to design a pattern when densely arranging terminal blocks of three phases (six in total) in one row. It is also possible to shift the terminal blocks one by one without arranging them in one row, but since the electric resistance increases correspondingly as the copper pattern becomes longer, an extra heat countermeasure is also required. On the other hand, it is possible to thicken the thickness without changing the width of the copper pattern or use a copper bar of the same thickness, but this countermeasure is expensive and not practical. Patent Literature 1 proposes a technique of directly connecting a power module to a terminal block by using a terminal block having an extremely special shape. However, in this case, a general-purpose inexpensive terminal block cannot be used. In addition, it is necessary to perform a step of soldering the two components on the opposite side with the printed wiring board interposed therebetween separately from a step of soldering the other devices. As a result, this technique is inconvenient in the manufacturing process.

In view of the above-described problems of the related art, an object of the invention is to provide a module-terminal block connection structure and a module-terminal block connection method which easily cope with heat of a printed wiring board and are suitable for manufacturing without using a terminal block having an extremely special shape.

Solution to Problem (1) The invention provides a module-terminal block connection structure including: a printed wiring board; a terminal block which is disposed on one surface (1a) of the printed wiring board and is formed into a three-dimensional shape by a conductive material, the terminal block being fixed to the printed wiring board; a module which is disposed on the other surface of the printed wiring board and includes an electric circuit and a press-fit type lead pin used as a circuit terminal; and a conductive portion which is electrically connected to the terminal block and includes a hole for press-inserting the lead pin thereinto, the conductive portion being electrically connected to the module while the lead pin is press-inserted into the hole.

In such a module-terminal block connection structure, the module and the terminal block can be electrically connected to each other in such a manner that the terminal block and the device to be mounted are mounted on one surface of the printed wiring board and thereafter the lead pin is press-inserted from the other surface. Thus, the lead pin does not need soldering. Also, since the press-fit type lead pin can be connected if only holes are formed even in a narrow place, connection can be realized in the vicinity of the terminal block, and the conductive portion can be suppressed from being heated when a large current flows. Moreover, the terminal block contributes to heat dissipation. Thus, it is possible to provide a module-terminal block connection structure which easily copes with heat of a printed wiring board and is suitable for manufacturing without using a terminal block having an extremely special shape.

(2) Further, in the module-terminal block connection structure of (1), the lead pin may exist within a region of the terminal block when the printed wiring board is viewed from above.

In this case, since the lead pin is inserted from the rear side of the terminal block and the pin tip comes out to an "under-crotch-area" of the terminal block, a distance from the lead pin to the terminal block becomes short and thus the conduction of heat to the terminal block and the dissipation of heat from the terminal block can be promoted. Further, since the electric resistance becomes smaller as the distance becomes shorter, the voltage drop can be suppressed.

(3) Further, in the module-terminal block connection structure of (1) or (2), the conductive portion may be a copper pattern formed on both surfaces of the printed wiring board and the hole may be a through-hole.

In this case, by using the copper patterns of both surfaces, current flows and the heat can be dispersed to escape therefrom.

(4) Further, in the module-terminal block connection structure of (2), the terminal block may include a top plate portion to which the external wire is attached, a pair of side portions, a leg portion which is formed at a lower end of each side portion, and a bottom portion which is provided to be bridged between the pair of side portions, and also, the bottom portion may be the conductive portion.

In this case, since the lead pin can be directly connected to the terminal block, the electric resistance of the whole electric circuit is further reduced and thus the generation of heat of the whole electric circuit can be suppressed. Further, it is possible to suppress the heat of the module from being directly conducted from the lead pin to the printed wiring board.

(5) Further, in the module-terminal block connection structure of any one of (1) to (4), the module may be a power module which controls a current supplied to a motor by switching.

A radiation fin or the like is generally attached to the power module since heat is generated due to switching loss caused when a current which is larger than that of the control circuit flows to the power module. According to the module-terminal block connection structure, since the dissipation of heat from the terminal block can be also promoted, the heat dissipation effect of the power module is excellent.

(6) Meanwhile, the invention provides a module-terminal block connection method of electrically connecting a lead pin corresponding to a circuit terminal of a module of an electric circuit to a terminal block used for connection with an external wire, the module-terminal block connection method including: (i) mounting the terminal block and a conductive portion electrically connected to the terminal block and including a hole for press-inserting the lead pin thereinto onto a printed wiring board; and (ii) disposing the module on the side opposite to the terminal block in the printed wiring board and press-inserting the press-fit type lead pin into the hole so that the module is electrically connected to the terminal block.

According to such a module-terminal block connection method, the module and the terminal block can be electrically connected to each other in such a manner that the terminal block and the device to be mounted are mounted on one surface of the printed wiring board and thereafter the lead pin is press-inserted from the other surface. Thus, the lead pin does not need soldering. Also, since the press-fit type lead pin can be connected if only holes are formed even in a narrow place, connection can be realized in the vicinity of the terminal block, and the conductive portion can be suppressed from being heated when a large current flows. Moreover, the terminal block contributes to heat dissipation. Thus, it is possible to provide a module-terminal block connection method which easily copes with heat of a printed wiring board and is suitable for manufacturing without using a terminal block having an extremely special shape.

Advantageous Effects of Invention

According to the invention, it is possible to provide a module-terminal block connection structure and a module-terminal block connection method which easily cope with heat of a printed wiring board and are suitable for manufacturing without using a terminal block having an extremely special shape.

DESCRIPTION OF EMBODIMENTS

Hereinafter, embodiments of the invention will be described with reference to the drawings.

Figure 1:
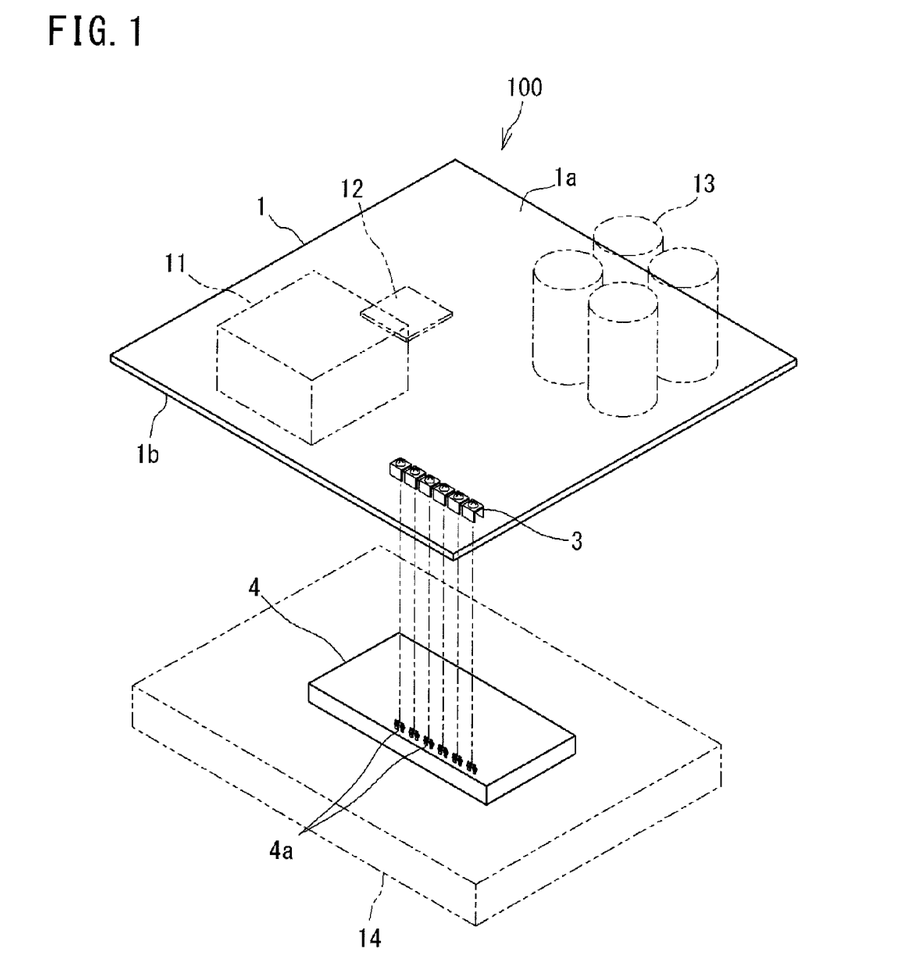
FIG. 1 is a perspective view illustrating an outline of a printed wiring board unit mounted to, for example, an air conditioner.

FIG. 1 is a perspective view illustrating an outline of a printed wiring board unit 100 mounted to, for example, an air conditioner. For example, a power supply circuit 11, a CPU 12, a capacitor 13, other circuit components, and connection members such as a terminal block 3 and a connector (not illustrated) are mounted on a front surface 1a of a printed wiring board 1. The terminal block 3 is used for a main circuit to which a large current, that cannot forces to flow in a connector, flows. The main circuit is a circuit that supplies a current to, for example, a motor (not illustrated) that drives a compressor in the air conditioner. The terminal blocks 3 are arranged with ensuring a necessary insulation distance therebetween.

A power module 4 is provided on a rear surface 1b of the printed wiring board 1. A radiation fin 14 is attached to the power module 4 that generates heat due to switching loss or the like. The power module 4 is formed such that a motor drive circuit including an inverter is packaged with a resin, and lead pins 4a necessary for connection with the outside are projected therefrom. Since the lead pins 4a are used for the main circuit and control, more lead pins actually exist. However, only six lead pins 4a corresponding to input terminals (three phases: R, S, T) and output terminals (three phases: u, v, w) for the main circuit are briefly depicted herein.

Figure 3:
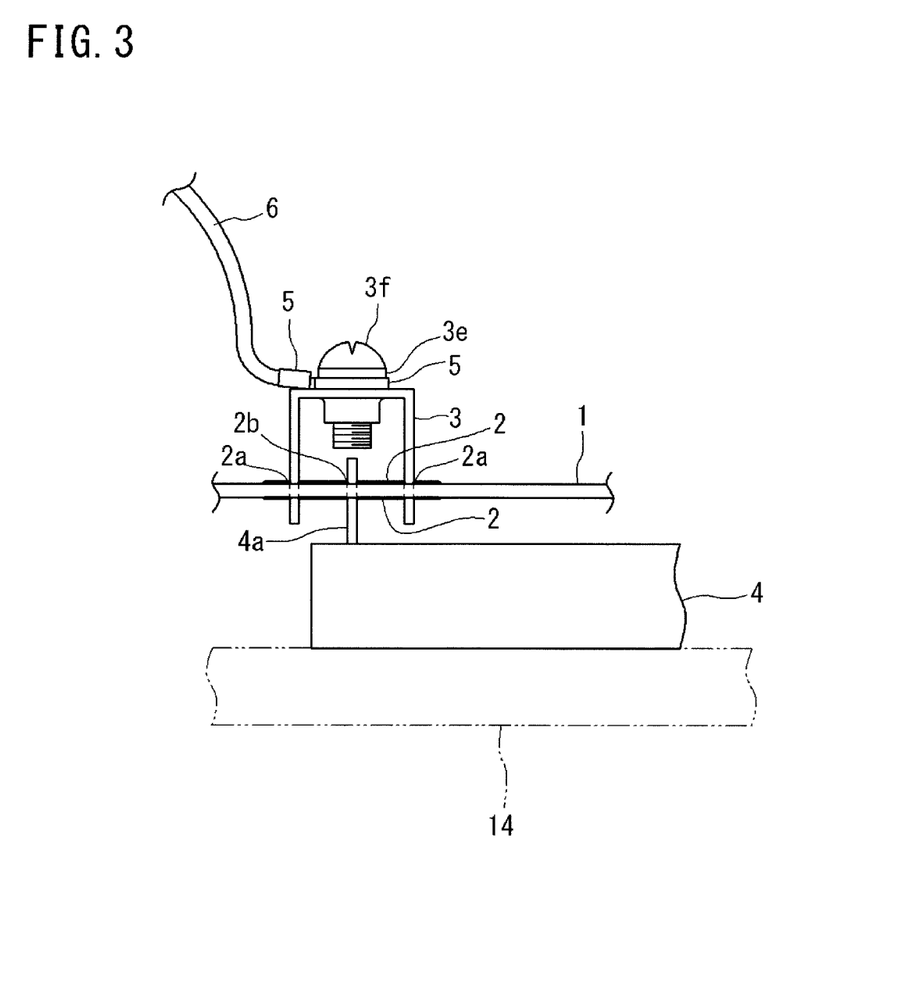
FIG. 3 is a view illustrating a state where an electric wire is further connected to the module-terminal block connection structure assembled in the manner illustrated in FIG. 2.

Each component to be mounted on the front surface 1a of the printed wiring board 1 is designed such that a tip of an electrode or an attachment leg slightly protrudes toward the rear surface 1b and is soldered to the rear surface 1b by, for example, a flow method using a solder bath so as to be securely mounted on the printed wiring board 1. Further, a hole (to be described later in detail) for inserting the lead pin 4a thereinto is formed on the inner lower side of the terminal block 3 and, when the lead pin 4a is pressed into this hole, the terminal block 3 and the lead pin 4a can be electrically and mechanically connected to each other. For example, a crimp terminal at a tip of an electric wire can be attached to the terminal block 3 while being interposed between the terminal block 3 and a male screw 3f (FIG. 3).

First Embodiment

Figure 2:
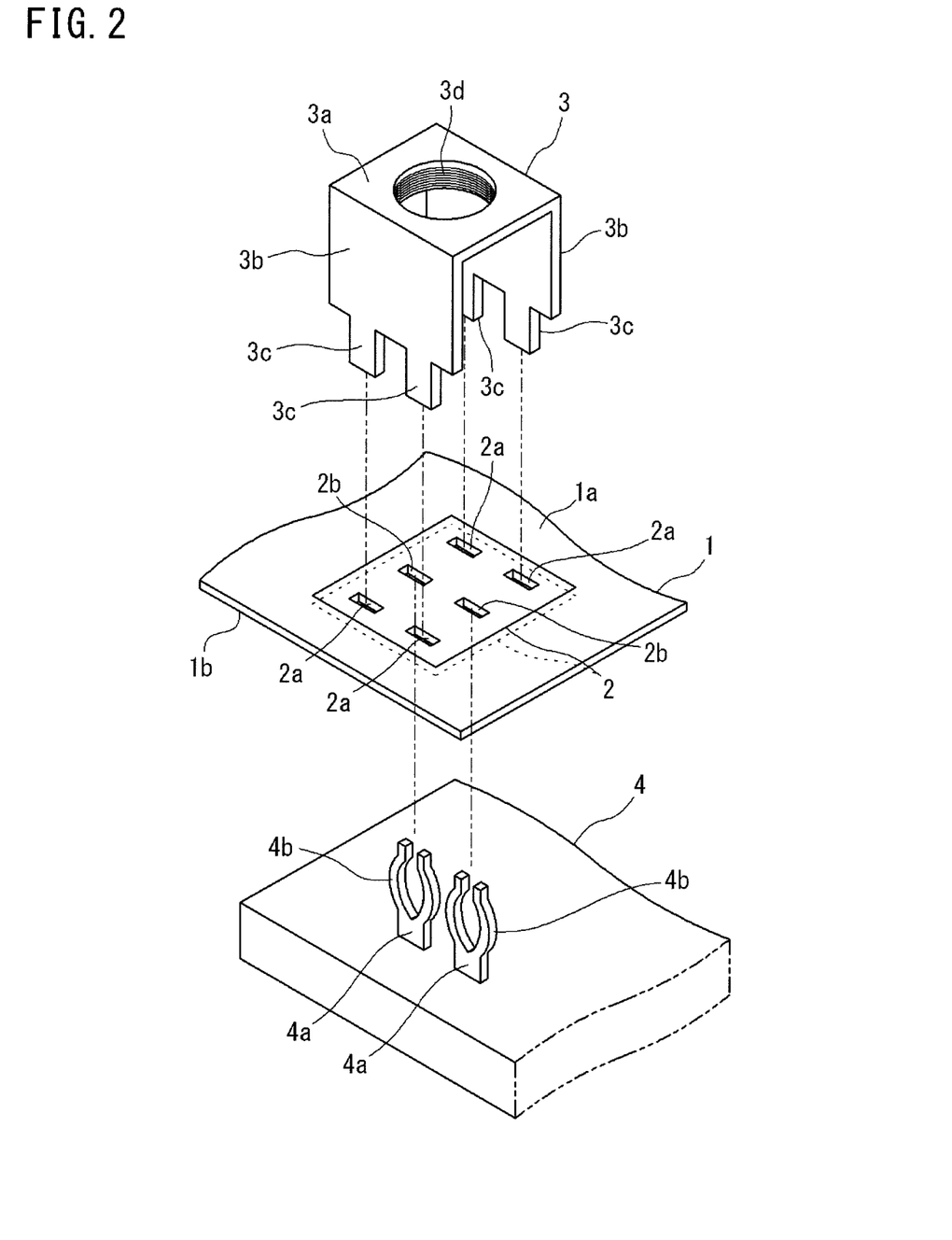
FIG. 2 is an enlarged perspective view of a module-terminal block connection structure (also a connection method) of a first embodiment focusing on one arbitrary terminal block in FIG. 1.

FIG. 2 is an enlarged perspective view of a module-terminal block connection structure (also a connection method) of a first embodiment focusing on one arbitrary terminal block 3 in FIG. 1. As illustrated in the drawing, the terminal block 3 is obtained by forming a conductive material into a three-dimensional shape. The terminal block 3 includes a top plate portion 3a of the upper surface of the drawing, a pair of side portions 3b, and leg portions 3c formed at a lower end of each side portion 3b. A female screw 3d is formed at the top plate portion 3a, for example, by burring. A male screw and the like of the terminal block 3 are not illustrated in FIG. 2. In fact, there is roundness (curvature) at a bent portion from the top plate portion 3a to the side portion 3b, but the bent portion is simply depicted herein.

A copper pattern 2 which is a "conductive portion" is formed at a predetermined position on the front surface 1a of the printed wiring board 1. A similar copper pattern 2 is also formed on the rear surface 1b and the copper patterns 2 on the front and rear surfaces are connected via through-holes 2a and 2b. The four through-holes 2a are located at positions corresponding to the leg portions 3c of the terminal block 3, and the leg portions 3c can pass therethrough. The leg portions 3c are fixed to the printed wiring board 1 by soldering. As a result, the terminal block 3 is electrically connected to the copper pattern 2 and is mechanically fixed.

The lead pin 4a protruding upward in the drawing from the power module 4 is a press-fit type pin. There are various types of press-fit type pins, but here, for example, there is one pair of U shapes as illustrated in the drawing (however, only one U-shaped pin can be also used in the copper pattern 2). The lead pin 4a has a press-fitting portion 4b that bulges outward slightly in the middle in the height direction. When the press-fit portion 4b is pressed into the through-hole 2b to be compressed and deformed, the lead pin 4a can be pressed into the printed wiring board 1. Accordingly, the lead pin 4a is electrically connected to the copper pattern 2.

In the module-terminal block connection structure assembled in the manner illustrated in FIG. 2, the lead pin 4a is within the region of the terminal block 3 when the terminal block 3 is viewed from just above the terminal block 3. In other words, the lead pin 4a exists in a space between the pair of side portions 3b below the top plate portion 3a, that is, an "under-crotch-area" of the terminal block 3.

FIG. 3 is a view illustrating a state where electric wires are further connected to the module-terminal block connection structure assembled in the manner illustrated in FIG. 2. An electric wire 6 having a crimp terminal 5 attached to its tip is connected to the terminal block 3. The crimp terminal 5 is fixed to the terminal block 3 by screwing the male screw 3f via a washer 3e.

The lead pin 4a press-inserted into the through-hole 2b is electrically connected to the terminal block 3 via the copper patterns 2 on both surfaces of the printed wiring board 1.

According to the above-described module-terminal block connection structure (connection method), the power module 4 and the terminal block 3 can be electrically connected to each other in such a manner that the terminal block 3 and the device to be mounted are mounted on one surface (front surface 1a) of the printed wiring board 1 and thereafter the lead pin 4a is press-inserted from the other surface (rear surface 1b). Thus, the lead pin 4a does not need soldering. Also, since the press-fit type lead pin 4a can be connected if only holes are formed even in a narrow place, connection can be realized in the vicinity of the terminal block 3, and the copper pattern 2 (conductive portion) can be suppressed from being heated when a large current flows thereto. Moreover, the terminal block 3 contributes to heat dissipation. Therefore, it is possible to provide a module-terminal block connection structure which easily copes with the heat of the printed wiring board 1 and is suitable for manufacturing without using a terminal block having an extremely special shape.

Further, in the connection structure in which the lead pin 4a exists within the region of the terminal block 3 when the printed wiring board 1 is viewed from above, since the lead pin 4a is inserted from the rear side of the terminal block 3 and the pin tip comes out to an under-crotch-area of the terminal block 3, a distance from the lead pin 4a to the terminal block 3 becomes short and thus the conduction of heat to the terminal block 3 and the dissipation of heat from the terminal block 3 via the copper pattern 2 can be promoted. Moreover, since the electric resistance becomes smaller as the distance becomes shorter, the voltage drop can be suppressed. Here, the copper patterns 2 provided on both surfaces (1a, 1b) of the printed wiring board 1 are connected to each other via the through-holes 2a and 2b. Therefore, by using the copper patterns 2 of both surfaces, current flows and the heat can be dispersed to escape therefrom.

Further, according to such a module-terminal block connection structure, since the dissipation of heat from the terminal block 3 can be promoted, the heat dissipation effect of the power module 4 is excellent.

Second Embodiment

Although it is desirable that the position of the lead pin 4a be within the region of the terminal block 3 when viewed from above, it is possible to prevent the copper pattern 2 from becoming longer if the lead pin is in the vicinity of the terminal block 3 instead of the position within the region. Thus, it is possible to suppress the generation of heat in the copper pattern 2 and to promote the dissipation of heat from the terminal block 3.

Figure 4:
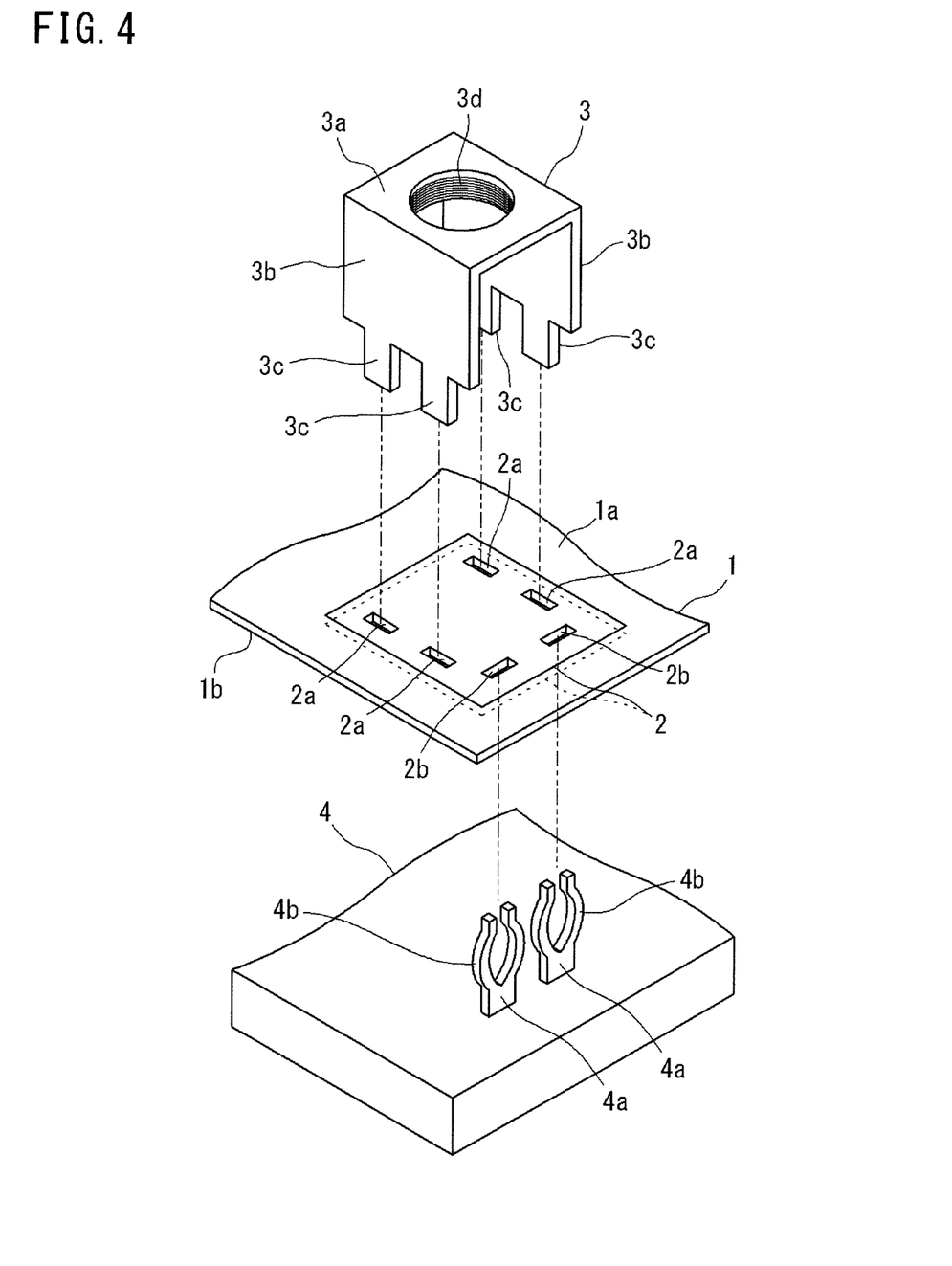
FIG. 4 is a perspective view of a module-terminal block connection structure in which lead pins are disposed in the vicinity of the terminal block instead of an "under-crotch-area" thereof.

For example, FIG. 4 is a perspective view of a module-terminal block connection structure in which the lead pins 4a are disposed in the vicinity of the terminal block 3 instead of the "under-crotch-area" thereof. The difference from FIG. 2 is that the through-hole 2b is formed in the vicinity of the outer side when the terminal block 3 is viewed above, and the other configuration is the same. Also in this case, since an increase in length of the copper pattern 2 can be suppressed similarly to FIG. 2, it is possible to suppress the generation of heat in the copper pattern 2 and promote the dissipation of heat from the terminal block 3. The direction of each of the lead pin 4a and the through-hole 2b is merely an example.

Figure 5:
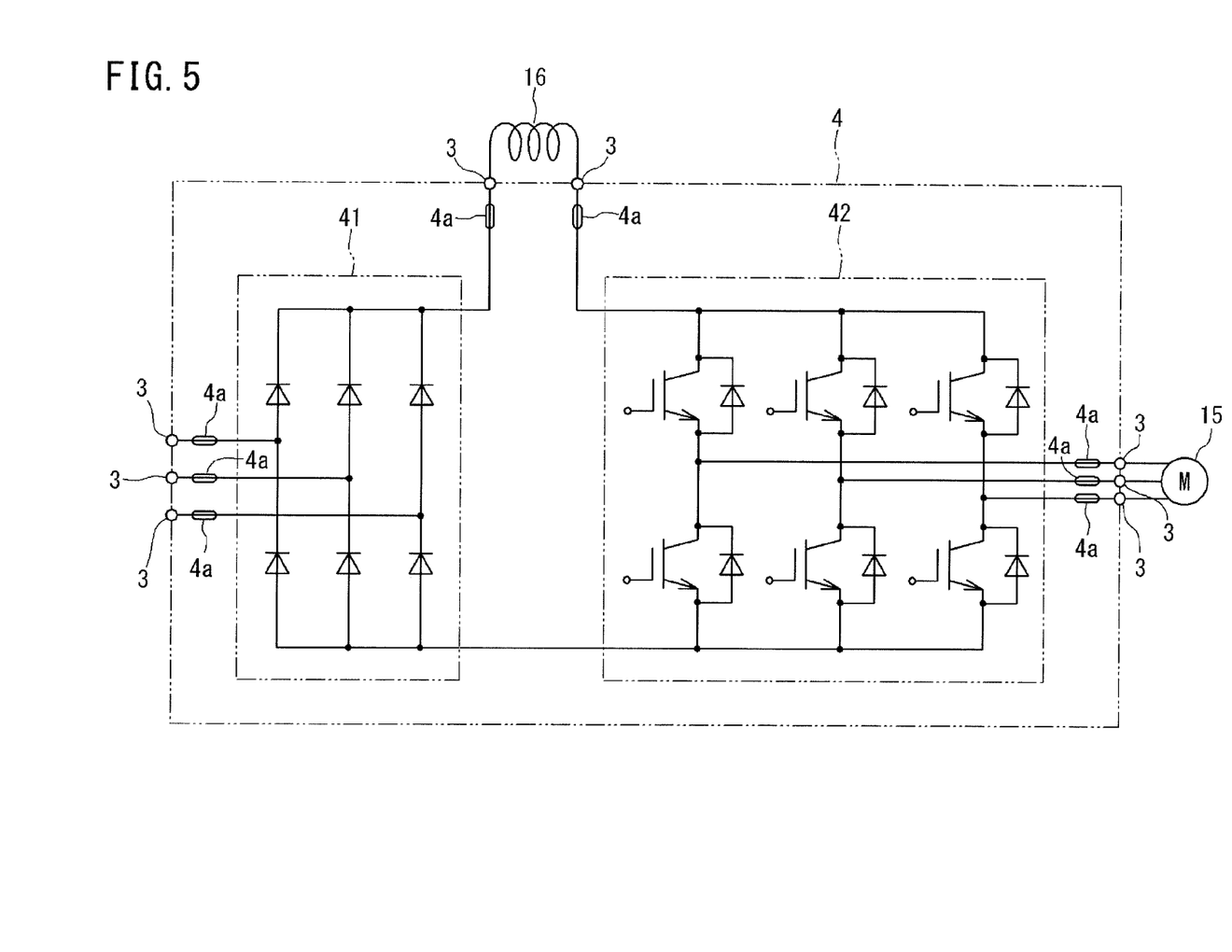
FIG. 5 is a diagram illustrating an outline (in which a control circuit is omitted) of a main circuit of a power module.

FIG. 5 is a diagram illustrating an outline (in which a control circuit is omitted) of the main circuit of the power module 4. The power module 4 includes a rectifier circuit 41 at a front stage and an inverter circuit 42 at a rear stage. If the terminal block 3 is used, the terminal block is used as an input terminal to the rectifier circuit 41 and an output terminal to the motor 15. In addition, since a reactor 16 is generally placed outside the power module 4, the terminal block 3 can also be used for connecting the reactor 16 and the power module 4. Then, the press-fit type lead pin 4a can be used in combination with the terminal block 3 as a set.

Third Embodiment

Figure 6:
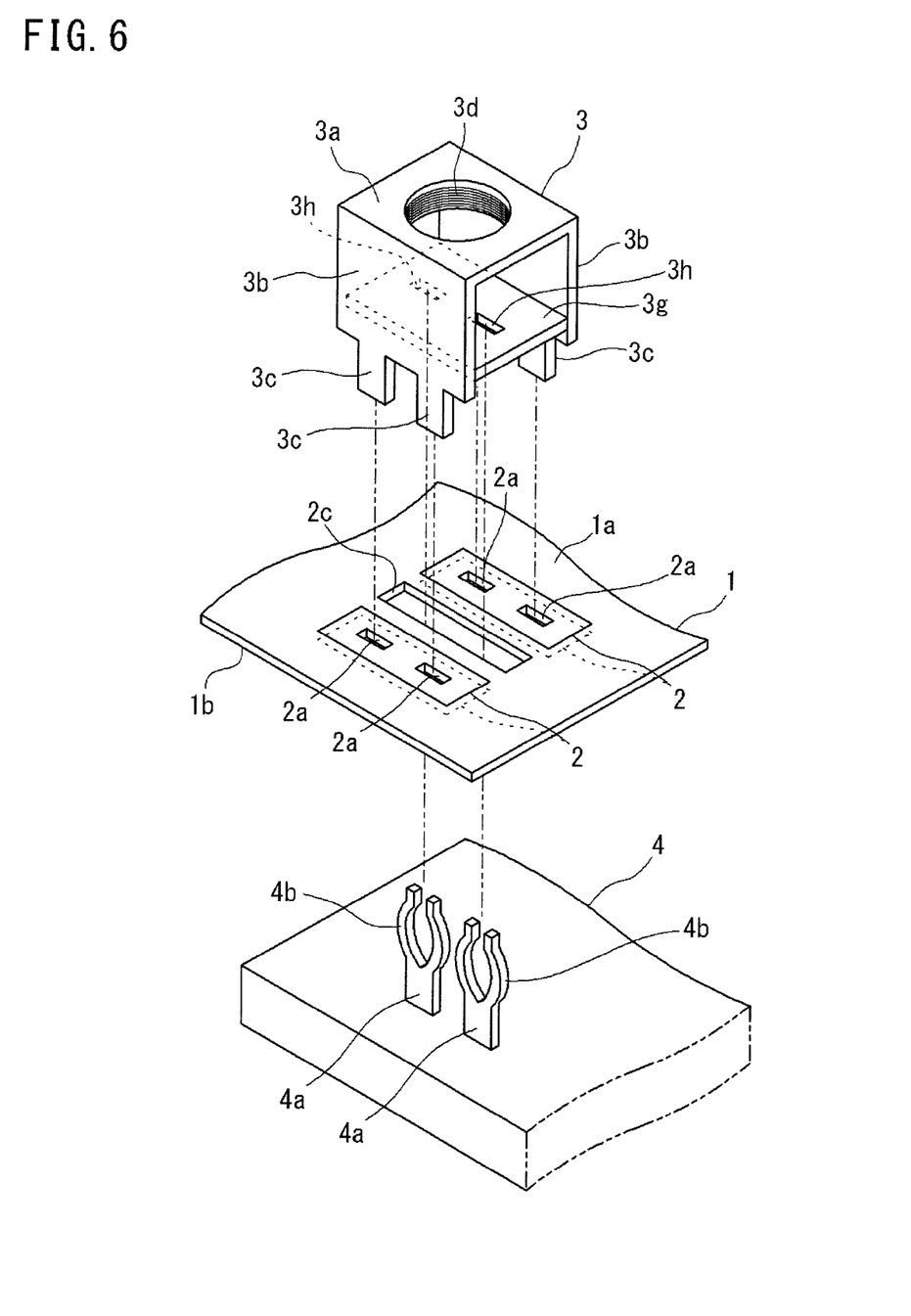
FIG. 6 is an enlarged perspective view of a module-terminal block connection structure (also a connection method) of a third embodiment.

FIG. 6 is an enlarged perspective view of a module-terminal block connection structure (also a connection method) of a third embodiment. As illustrated in the drawing, the terminal block 3 is obtained by forming a conductive material into a three-dimensional shape. The terminal block 3 includes the top plate portion 3a of the upper surface of the drawing, the pair of side portions 3b, and the leg portions 3c formed at a lower end of each side portion 3b and further includes a bottom portion 3g fixed to be bridged between the pair of side portions 3b. This embodiment is the same as the first embodiment except for the bottom portion 3g. The bottom portion 3g has a hole 3h for press-inserting the lead pin 4a thereinto. The bottom portion 3g serves as a part of the terminal block 3 and also serves as a conductive portion which is electrically connected to the lead pin 4a of the power module 4.

In the printed wiring board 1, a through-hole 2a is formed at a predetermined place corresponding to the leg portion 3c of the terminal block 3 and the copper pattern 2 is formed to surround the through-hole. The copper pattern 2 is formed on both surfaces of the printed wiring board 1. Further, a hole 2c for inserting the lead pin 4a therethrough is formed in the printed wiring board 1 to be located between the pair of copper patterns 2. The hole 2c is a simple penetration hole and is not a through-hole with copper pattern. The leg portion 3c of the terminal block 3 is fixed to the printed wiring board 1 by soldering.

The lead pin 4a which protrudes upward from the power module 4 is a press-fit type pin. Although there are various press-fit type pins, a press-fit type pin having a shape similar to that of the first embodiment is used. When the press-fitting portion 4b of the lead pin 4a is pressed into the hole 3h of the bottom portion 3g of the terminal block 3 to be compressed and deformed, the lead pin 4a is electrically connected to the copper pattern 2.

Even in the module-terminal block connection structure assembled in the manner of FIG. 6, the lead pin 4a exists within the region of the terminal block 3 when the terminal block 3 is viewed from just above the terminal block 3.

In the case of the module-terminal block connection structure of FIG. 6, since the lead pin 4a can be directly connected to the terminal block 3, the electric resistance of the whole electric circuit becomes smaller than those of the first and second embodiments and thus the generation of heat of the whole electric circuit can be suppressed. Further, it is possible to suppress the heat of the power module 4 from being directly conducted from the lead pin 4a to the printed wiring board 1.

<<Others>>

Figure 7:
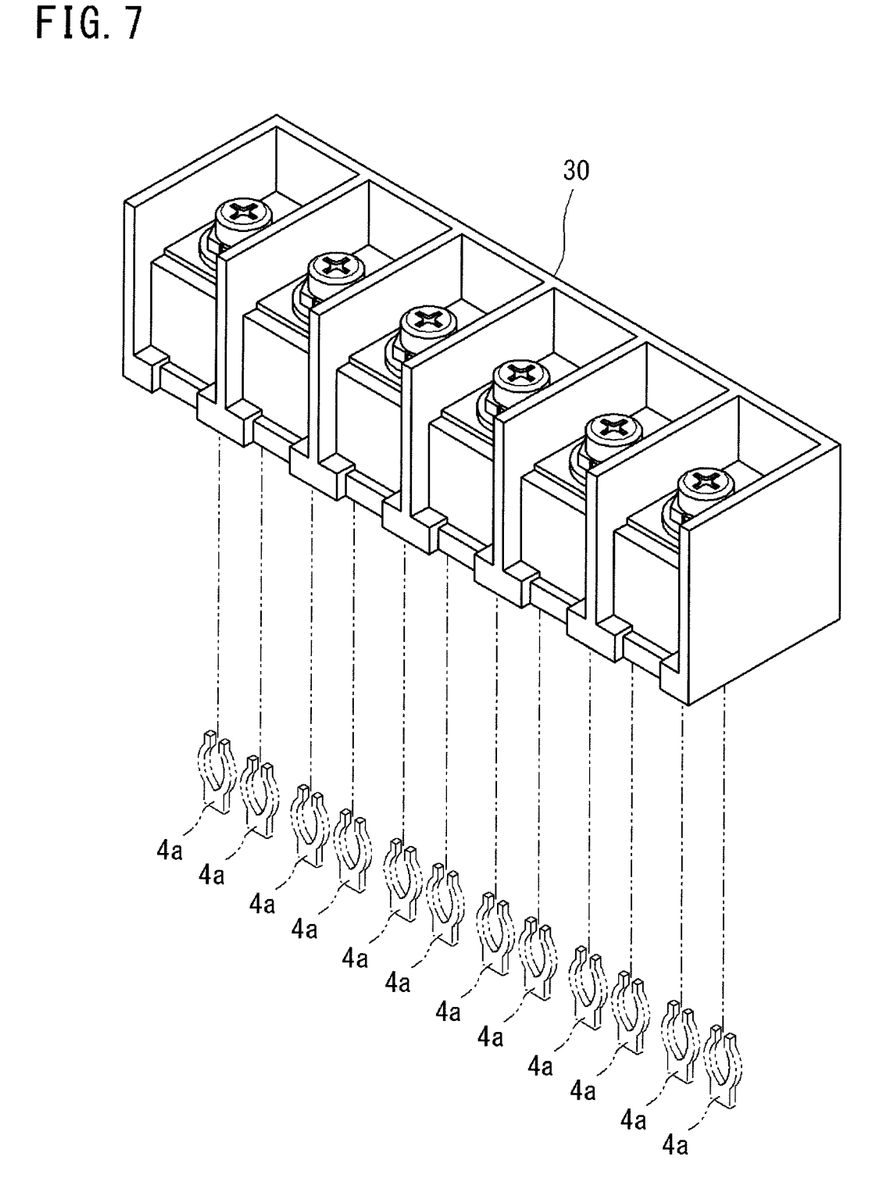
FIG. 7 is a perspective view illustrating a terminal block having a partition of an insulation member.

Further, for example, when an insulation distance between the parallel terminal blocks 3 of FIG. 1 cannot be ensured, a terminal block 30 having a partition in an insulation member illustrated in FIG. 7 can be used.

Furthermore, in the above-described embodiments, a connection structure (connection method) between the power module 4 and the terminal block 3 has been described, but the invention is not limited to the power module. For example, the same connection structure can be also applied to other modules (obtained by packaging a circuit and including a lead pin) which need to be connected to the terminal block provided on the printed wiring board.

REFERENCE SIGNS LIST

1: printed wiring board
1a: front surface
1b: rear surface
2: copper pattern
2a, 2b: through-hole
2c: hole
3: terminal block
3a: top plate portion
3b: side portion
3c: leg portion
3d: female screw
3e: washer
3f: male screw
3g: bottom portion
3h: hole
4: power module
4a: lead pin
4b: press-fitting portion
5: crimp terminal
6: electric wire
11: power supply circuit
12: CPU
13: capacitor
14: radiation fin
15: motor
16: reactor
30: terminal block
41: rectifier circuit
42: inverter circuit
100: printed wiring board unit

The invention claimed is:

1. A module-terminal block connection structure comprising:
a printed wiring board;
a terminal block which is disposed on one surface of the printed wiring board and is formed into a three-dimensional shape and is made of a conductive material, the terminal block being fixed to the printed wiring board;
a module which is disposed on the other surface of the printed wiring board and includes an electric circuit and a press-fit type lead pin used as a circuit terminal; and
a conductive portion which is electrically connected to the terminal block and includes a hole for press-inserting the lead pin thereinto, the conductive portion being electrically connected to the module while the lead pin is press-inserted into the hole,
wherein the terminal block includes a top plate portion to which the external wire is attached, a pair of side portions, a leg portion which is formed at a lower end of each side portion, and a bottom portion which is provided to be bridged between the pair of side portions, and also, the bottom portion is the conductive portion.

2. The module-terminal block connection structure according to claim 1, wherein the lead pin exists within a region of the terminal block when the printed wiring board is viewed from above.

3. The module-terminal block connection structure according to claim 1, further comprising a copper pattern formed on both surfaces of the printed wiring board and the hole is a through-hole.

4. The module-terminal block connection structure according to claim 1, wherein the module is a power module which controls a current supplied to a motor by switching.

5. A module-terminal block connection method of electrically connecting a lead pin corresponding to a circuit terminal of a module of an electric circuit to a terminal block used for connection with an external wire, wherein the terminal block includes a top plate portion to which the external wire is attached, a pair of side portions, a leg portion which is formed at a lower end of each side portion, and a conductive portion which is provided to be bridged between the pair of side portions, the module-terminal block connection method comprising:
mounting the terminal block and a conductive portion electrically connected to the terminal block and including a hole for press-inserting the lead pin thereinto onto a printed wiring board; and disposing the module on the side opposite to the terminal block in the printed wiring board and press-inserting the press-fit type lead pin into the hole so that the module is electrically connected to the terminal block.

6. The module-terminal block connection structure according to claim 2, further comprising a copper pattern formed on both surfaces of the printed wiring board and the hole is a through-hole.

7. The module-terminal block connection structure according to claim 2, wherein the module is a power module which controls a current supplied to a motor by switching.

8. The module-terminal block connection structure according to claim 3, wherein the module is a power module which controls a current supplied to a motor by switching.

* * * * *